United States Patent
Lees

(10) Patent No.: US 8,212,270 B2
(45) Date of Patent: Jul. 3, 2012

(54) CAVITY GLASS FOR LIGHT-EMISSIVE DEVICES AND A METHOD OF MANUFACTURING THE SAME

(75) Inventor: Russell Lees, Ely (GB); Angela Lees, legal representative, Ely (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 576 days.

(21) Appl. No.: 12/096,169

(22) PCT Filed: Dec. 1, 2006
(Under 37 CFR 1.47)

(86) PCT No.: PCT/GB2006/004493
§ 371 (c)(1),
(2), (4) Date: Oct. 5, 2009

(87) PCT Pub. No.: WO2007/066079
PCT Pub. Date: Jun. 14, 2007

(65) Prior Publication Data
US 2010/0109033 A1    May 6, 2010

(30) Foreign Application Priority Data

Dec. 5, 2005   (GB) .................................. 0524783.8

(51) Int. Cl.
*H01L 33/00* (2010.01)
(52) U.S. Cl. ............. 257/98; 438/26; 428/142; 427/161
(58) Field of Classification Search .................. 313/498, 313/504, 506, 509, 512; 257/98; 438/26; 428/142
See application file for complete search history.

(56) References Cited

U.S. PATENT DOCUMENTS

| 6,737,176 B1 | 5/2004 | Otsuki et al. |
| 2002/0155320 A1 | 10/2002 | Park et al. |
| 2003/0224108 A1 | 12/2003 | Pollara |
| 2003/0230795 A1 | 12/2003 | Yoshii et al. |
| 2005/0046349 A1 | 3/2005 | Tanaka et al. |

FOREIGN PATENT DOCUMENTS

| DE | 10236855 | 2/2004 |
| EP | 1387406 | 2/2004 |
| EP | 1411562 | 4/2004 |
| JP | 2003 262853 | 9/2003 |
| JP | 2004 303630 | 10/2004 |
| JP | 2005050596 | 2/2005 |

OTHER PUBLICATIONS

International Search Report and Written Opinion for PCT/GB2006/004493 dated Mar. 30, 2007.
Combined Search and Examination Report for GB0524783.8 dated Apr. 18, 2006.

*Primary Examiner* — Vip Patel
(74) *Attorney, Agent, or Firm* — Marshall, Gerstein & Borun LLP

(57) ABSTRACT

A method of manufacturing a transparent encapsulating sheet for a light-emissive device, the method comprising the steps: forming a plurality of cavities in one side of a transparent sheet of material for receiving light-emissive structures therein, said forming step producing a frosted surface comprising micro cracks in the cavities; coating said frosted surface with a low viscosity material whereby the micro cracks in the frosted surface are filled with the low viscosity material in order to form the transparent encapsulating sheet.

10 Claims, 4 Drawing Sheets

CAVITY GLASS FOR LIGHT-EMISSIVE DEVICES AND A METHOD OF MANUFACTURING THE SAME

FIELD OF INVENTION

The present invention relates to cavity glass for light-emissive devices and a method of manufacturing the same.

BACKGROUND OF INVENTION

Light-emissive devices, such as organic electroluminescent devices, are known, for example, from PCT/WO/13148 and U.S. Pat. No. 4,539,507. Such a device is illustrated in FIG. 1 and generally comprises: a substrate 2; a first electrode 4 disposed over the substrate 2 for injecting charge of a first plurality; a second electrode 6 disposed over the first electrode 4 for injecting charge of a second plurality opposite to said first plurality; an organic light-emissive layer 8 disposed between the first and second electrodes; and an encapsulant 10 disposed over the second electrode 6. In the arrangement shown in FIG. 1, the second electrode 6 and the encapsulant 10 are transparent so as to allow light emitted from the organic light-emissive layer 8 to pass therethrough. Such an arrangement is known as a top-emitting device. An example of a transparent encapsulant is a glass can encapsulant in which a sheet of glass having a cavity therein is disposed over the light-emissive structure comprising the electrodes and light-emissive layer. A further encapsulating layer may be provided in the form of a thin film encapsulant deposited over the upper surface of the top electrode.

Variations of the above-described structure are known. The first electrode may be the anode and the second electrode may be the cathode. Alternatively, the first electrode may be the cathode and the second electrode may be the anode. Other layers may be provided between the electrodes and organic light-emissive layer in order to aid charge injection and transport. Furthermore, a getter material may be disposed inside the cavity of the encapsulant 10 in order to absorb any moisture and oxygen and thus prolong the lifetime of the device. The electrodes and light-emissive layer (and any additional layers such as the charge injection and transport layers discussed above) constitute a light-emissive structure which may be pixelated in order to form a display comprising a plurality of emitting pixels. Methods of forming pixelated displays are well known in the art.

FIG. 2 shows a simplified schematic diagram illustrating a portion of a pre-form fabricated during manufacture of a plurality of electroluminescent devices. The pre-form comprises a common substrate 2 over which a plurality of anodes 4, organic electroluminescent material 8, and cathodes 6 are deposited to form a plurality of light-emissive structures. A common encapsulant 10 is disposed over the light-emitting structures and is adhered to the substrate 2 by lines of adhesive or solder. The encapsulant 10 comprises a sheet having a plurality of cavities formed therein, the cavities corresponding to the positions of the plurality of light-emissive structures. The pre-form is broken along lines (indicated as dashed lines in FIG. 2) between the plurality of light-emissive structures so as to produce a plurality of encapsulated light-emissive devices. A more complex sealing structure (not shown) may be provided to allow for easier breaking. For example lines of weakness may be provided by, for example, grooves, and/or the arrangement may be scribed prior to breaking in a scribe and break process.

Each light-emissive structure may comprise a single emitting component such as for use in a simple backlight. Alternatively, each light-emissive structure may comprise a plurality of pixels to form a display.

The pre-form is manufactured by depositing layers to form the light-emissive structures on the substrate and then adhering the prefabricated encapsulating sheet thereover.

FIG. 3 shows a portion of the prefabricated encapsulating sheet 10 which comprises a transparent sheet of material having a plurality of cavities 12 in one side thereof for receiving the light-emissive structures.

The method of manufacturing the encapsulating sheet is illustrated in FIG. 4. The cavities 12 are formed by etching the transparent sheet 10 in a first step 100. The etch step typically is carried out by sandblasting which produces a frosted surface 14 on the interior of the cavities 12 which is substantially opaque. In order to convert the frosted cavity glass into transparent cavity glass, the cavity glass is chemically milled (step 200) so as to etch away the frosted surface 14 in order to form cavities 12 having transparent surfaces 16.

A problem with the aforementioned manufacturing process is that the chemical milling step is very expensive. Furthermore, as the chemical milling process involves the removal of glass material, a thicker sheet of glass is required initially in order to provide an encapsulating sheet having sufficient strength to protect the underlying light-emissive structure in the final product. Furthermore, the chemicals used in the milling step are toxic and environmentally unfriendly.

SUMMARY OF INVENTION

It is an aim of the present invention to solve the aforementioned problems with the current manufacturing process for producing transparent cavity encapsulants for light-emissive devices.

In accordance with a first aspect of the present invention there is provided a method of manufacturing a transparent encapsulating sheet for a light-emissive device, the method comprising the steps: forming a plurality of cavities in one side of a transparent sheet of material for receiving light-emissive structures therein, said forming step producing a frosted surface comprising micro-cracks in the cavities; coating said frosted surface with a low viscosity material whereby the micro cracks in the frosted surface are filled with the low viscosity material in order to form the transparent encapsulating sheet.

In accordance with a second aspect of the present invention there is provided a transparent encapsulating sheet for a light-emissive display, the transparent encapsulating sheet comprising a transparent sheet of material having a plurality of cavities in one side thereof for receiving light-emissive structures, the cavities having frosted surfaces having micro-cracks therein with a transparent material disposed on the frosted surfaces and filling the micro cracks of the frosted surfaces thereby rendering the frosted surfaces transparent.

By low viscosity material we mean a material which is of low enough viscosity, and has a low enough contact angle with the material of the transparent sheet, so as to coat the frosted surface and fill micro-cracks in the frosted surface thereby rendering the frosted surface transparent.

By micro-cracks we mean a plurality of small cracks, cavities, defects or the like which result in the surface being frosted.

The above-described process differs from the prior art method of manufacturing a transparent encapsulating sheet in that the micro-cracks in the frosted surface are filled with a transparent material rather than being chemically etched away in a chemical milling step. The presently proposed method uses an additive process rather than a subtractive process in order to transform the non-even frosted surface into an even transparent surface. Furthermore, the presently proposed process negates the requirement for an expensive chemical milling step as previously required, thus saving cost. The present invention also negates the requirement for the use of toxic and expensive chemicals and is therefore more environmentally friendly and safer for workers involved in the manufacturing process.

Preferably, after the coating step the low viscosity material is cured. Although, it is usual that the low viscosity material will be transparent in its uncured state as well as when cured, it is only essential that the material is transparent in its cured state if a curing step is used. If a curing step is not used, then the material must be transparent in its uncured state.

In the curing step, if a thermal cure is used then this can result in movement within the low viscosity material forming ripples which remain in the cured product. This results in a poor optical surface and thus it is advantageous to use a low temperature cure (for example, less than 50 degrees centigrade) and more preferably to avoid thermal curing altogether by using a UV cure or a chemical cure using an initiator and a catalyst.

Although the process of the present invention can be realised using any low viscosity material which is transparent (at least after curing), it is advantageous to index match the low viscosity material with the material of the encapsulating sheet so as to minimise the change in refractive index at the coated surface. Such an arrangement will minimise optical effects occurring at this surface which can impact on the performance of the light-emissive device. Preferably, the refractive index of the low viscosity index matched material is within 0.2 of the material of the encapsulating sheet, more preferably 0.1, and most preferably the same as the refractive index of the encapsulating sheet. The low viscosity material can be index matched to the $4^{th}$ or $5^{th}$ significant figure.

Examples of low viscosity materials are transparent epoxy resins, silicon gels, hydrocarbon blends or starches. Epoxy resins are available from Nagasse, silicon gels are available from Dow Corning, hydrocarbon blends are available from Futaba, and starches are available from National Starch.

The low viscosity material may comprise a getter material so as to fulfill the dual function of forming a transparent surface and absorbing oxygen, moisture and/or other species which may cause degradation of the final device. Alternatively, a separate getter material may be provided. In one embodiment, a transparent layer of getter material is provided over the layer of low viscosity material. A plurality of getters may be provided each having a specific functionality. These may be provided in a blend or as separate materials. For example, a plurality of layers of transparent getter material may be deposited. A suitable commercially available getter material is OleDry® from Futaba Corporation which can be deposited from solution and dried.

Preferably the transparent encapsulant comprises a glass material. However, it is also envisaged that the present invention may be utilised with other transparent materials such as silicon, quartz, and plastics.

The refractive index of glass material can vary according to the specific composition of glass utilised and is typically in the range 1.4 to 2.1. Accordingly, when using a glass sheet for the encapsulant, it is preferred that the low viscosity curable material has a refractive index in the range 1.4 to 2.1, preferably about 1.5, when cured.

Preferably the glass sheets have a thickness of between 0.7 to 1.5 mm. Preferably, the cavities are etched to a half glass thickness. A typical sheet will be of a size 14 inches by 14 inches with 132 cavities etched therein.

Typically the etching process for forming the cavities is performed by sandblast or bead blasting using urea beads. However, other etching processes may be utilised such as laser ablation.

In prior art methods, a slower sandblasting process step is typically utilised in order to form smaller micro cracks which are more easy to remove by chemically milling. Even then, such micro cracks take a relatively long time to chemically mill. In contrast, the present invention allows for use of a faster sandblasting process as larger micro-cracks can readily be filled with low viscosity material in accordance with the present invention.

Low viscosity material is deposited to a depth of between 50 to 700 micrometers (this depth including the depth of material in the micro cracks of the frosted surface). The micro cracks are typically of a depth of 50 micrometers depending on the rate of sandblasting and the size of grains utilised. For 50 micrometer deep micro cracks, typically a 100 micrometer layer of low viscosity material is deposited to ensure that all the micro cracks are filled and a flat surface is provided.

In one simple embodiment, the coating step involves turning over the cavity glass such that the cavities are facing upwards and then pouring the low viscosity material into the upturned cavities and over the frosted surfaces.

In order to dispense the low viscosity material, a micro dispensing system may be utilised which controls the amount of material deposited. Examples include a needle valve dispensing system and an elliptical coil dispensing system.

Typically the viscosity of the low viscosity material is approximately the same as that of water. However, it is possible to tune the viscosity and contact angle of the material by simply selecting a suitable material from the range provided by standard suppliers. Preferably, the viscosity should be less than 10E-3 Pa·S. Preferably, the contact angle of the low viscosity material with the transparent encapsulant is less than 20°.

When using an epoxy resin as the low viscosity material, the wetting angle of the epoxy resin will be determined by the filler size. A typical epoxy resin includes epoxy and a filler used to tune the viscosity and contact angle of the resin and the properties of the cured product (e.g. hardness, permeability to gasses and chemical resistance). Typically, epoxy resins have a filler comprising flakes of between 20 and 30 micrometers. However, in embodiments of the present invention, it is advantageous to provide a filler having flakes of a smaller size, for example, less than 10 micrometers, more preferably 6 to 8 micrometers. Alternatively, no filler at all may be provided although this will result in a softer compound when cured. Examples of fillers are exfoliated nano clays, glass, mica and silica. A wide of range different resins are commercially available from epoxy manufacturers and it is possible to purchase a suitable resin by providing the functional specifications to a manufacture who can then supply a suitable resin to meet the functional specifications.

In accordance with a third aspect of the present invention there is provided a method of manufacturing a pre-form comprising depositing a plurality of light-emissive structures on a substrate and encapsulating the plurality of light-emissive structures using the encapsulating sheet of the second aspect of the invention.

In accordance with a fourth aspect of the present invention there is provided a method of manufacturing a plurality of light-emissive devices comprising forming the pre-form using the method of the third aspect of the invention and subsequently breaking the pre-form along lines between the plurality of light-emissive structures to provide a plurality of light-emissive devices.

In accordance with a fifth aspect of the present invention there is provided a pre-form comprising a substrate, a plurality of light-emissive structures disposed over the substrate and a transparent encapsulating sheet according to the second aspect of the invention disposed over the light-emissive structures.

Typically there is an up to 4% loss of light at air-solid interfaces. Thus, there is approximately an 8% loss caused by the presence of a gas cavity between the upper surface of the light-emissive structure and the encapsulating glass. In one arrangement, the transparent material within each cavity extends from the transparent sheet to the light-emissive structure thereby completely filling space between the transparent sheet and the upper surface of the light-emissive structure. Such an arrangement decreases the amount of light lost in the device and also increases device strength. This can also prevent the encapsulating sheet from damaging the light-emissive structure by bowing and impacting on the light-emissive structure which can occur in prior art arrangements, particularly for large devices. The problem of bowing typically occurs at a display size of between 3 to 7 inches but will vary according to the thickness and type of material used for the encapsulating sheet. The transparent material may completely fill the cavity around the light-emissive structure for a more robust display.

It is important to note that the transparent material will usually have a different coefficient of thermal expansion (CTE) to that of the material of the transparent sheet. Typically the transparent material will have a high CTE and the material of the transparent sheet will have a low CTE. Accordingly, in some embodiments it is advantageous to provide an expansion gap between the light-emissive structure and the transparent material. If no expansion gap is provided, it is advantageous to select a transparent material which has a relatively low CTE to match that of the material of the transparent sheet. Preferably, the CTE should be similar to glass (3 to 9 ($\times 10^{-6}$/° C.)).

In one embodiment, each light emitting structure comprises a first electrode disposed over the substrate for injecting charge of a first polarity; a second electrode disposed over the first electrode for injecting charge of a second polarity opposite to said first polarity; and a light-emissive layer disposed between the first and second electrodes, the second electrode being transparent so as to allow light emitted from the light-emissive layer to pass therethrough.

In accordance with a sixth aspect of the present invention there is provided a light-emissive device comprising a substrate, a light-emissive structure disposed over the substrate and a transparent encapsulating sheet disposed over the light-emissive structure, wherein the transparent encapsulating sheet comprises a transparent sheet of material having a cavity in one side thereof in which the light-emissive structure is disposed, the cavity having a frosted surface having micro cracks therein with a cured transparent material disposed on the frosted surface and filling the micro cracks of the frosted surface thereby rendering the frosted surface transparent.

In accordance with a seventh aspect of the present invention there is provided a method of manufacturing a pre-form comprising depositing a plurality of light-emissive structures on a substrate, depositing a low viscosity material over the light-emissive structures and encapsulating the plurality of light-emissive structures using an encapsulating sheet comprising cavities with frosted surfaces having micro cracks, whereby the low viscosity material coats the frosted surfaces and fills the micro cracks thereby forming a transparent encapsulant. Preferably, the low viscosity material is cured after application of the encapsulating sheet.

BRIEF DESCRIPTION OF THE DRAWINGS

For a better understanding of the present invention and to show how the same may be carried into effect, embodiments of the present invention will now be described by way of example, with reference to the accompanying drawings, in which.

DETAILED DESCRIPTION OF THE PREFERRED EMBODIMENT OF THE INVENTION

Figure 1:
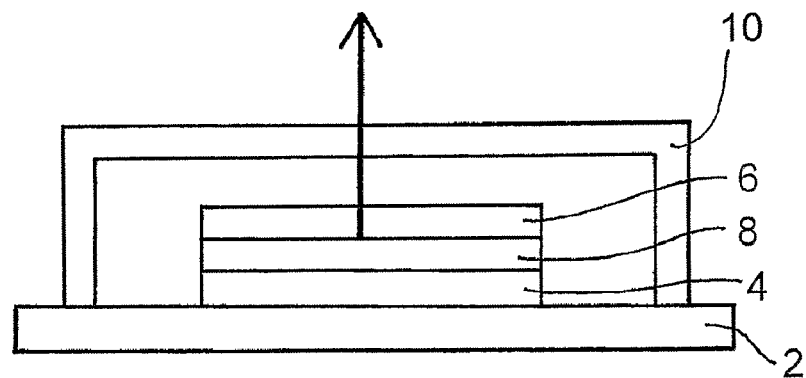
FIG. 1 shows a top emitting light-emissive device.
Figure 2:
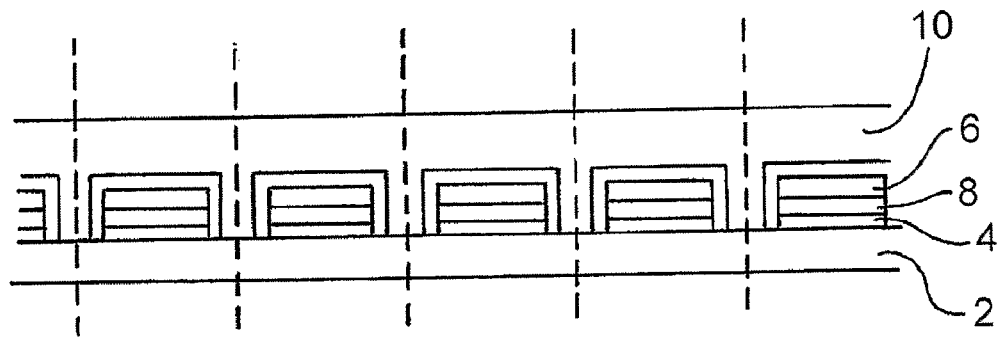
FIG. 2 shows a pre-form for manufacturing a plurality of top emitting light-emissive devices.
Figure 3:
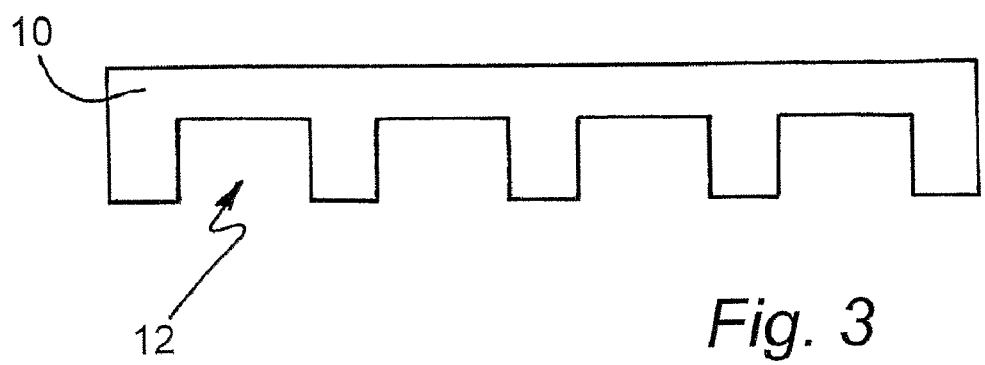
FIG. 3 shows a portion of a transparent encapsulating sheet for use in manufacturing the pre-form shown in FIG. 2.
Figure 4:
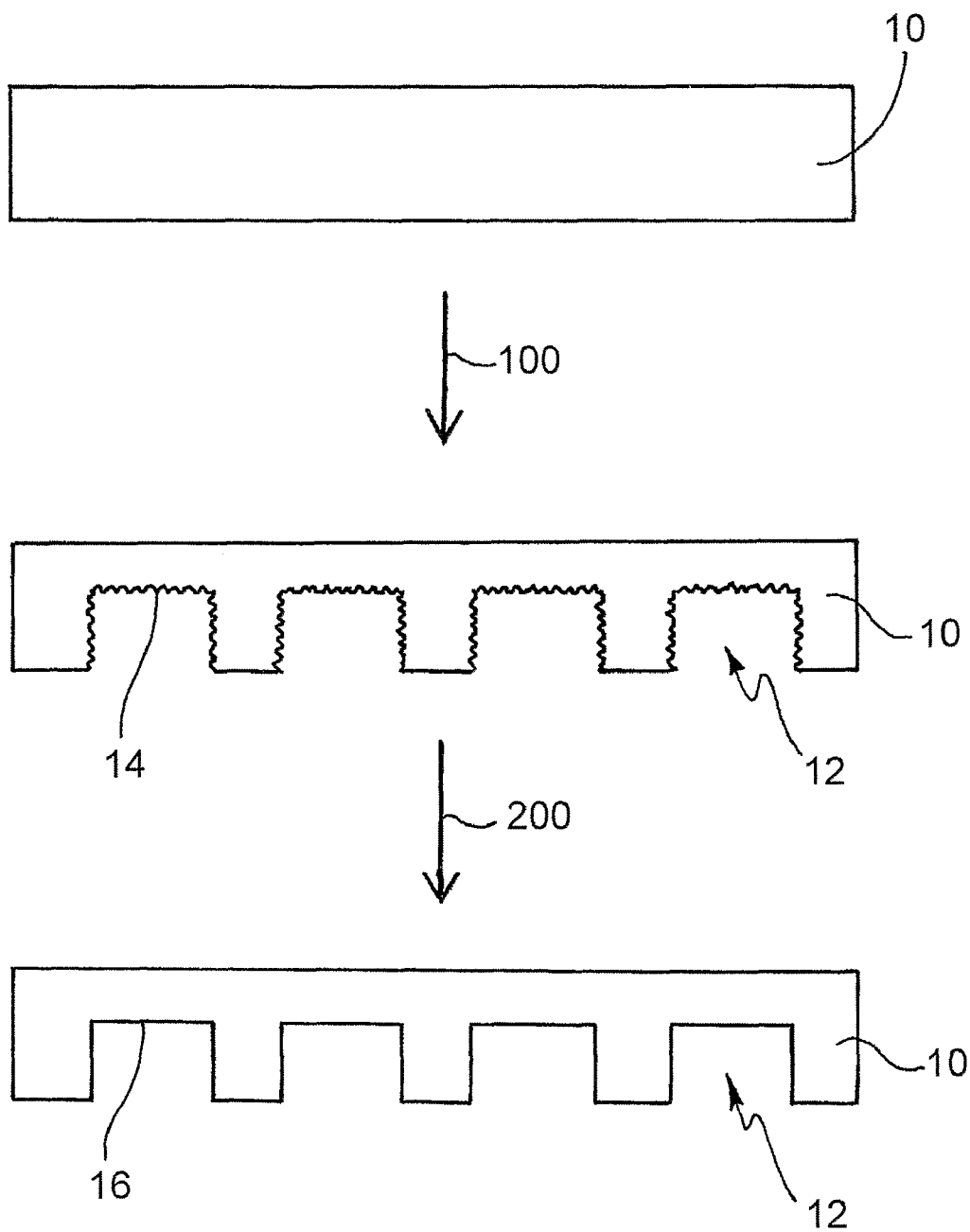
FIG. 4 illustrates the steps in a prior art method of manufacturing the transparent encapsulating sheet shown in FIG. 3.
Figure 5:
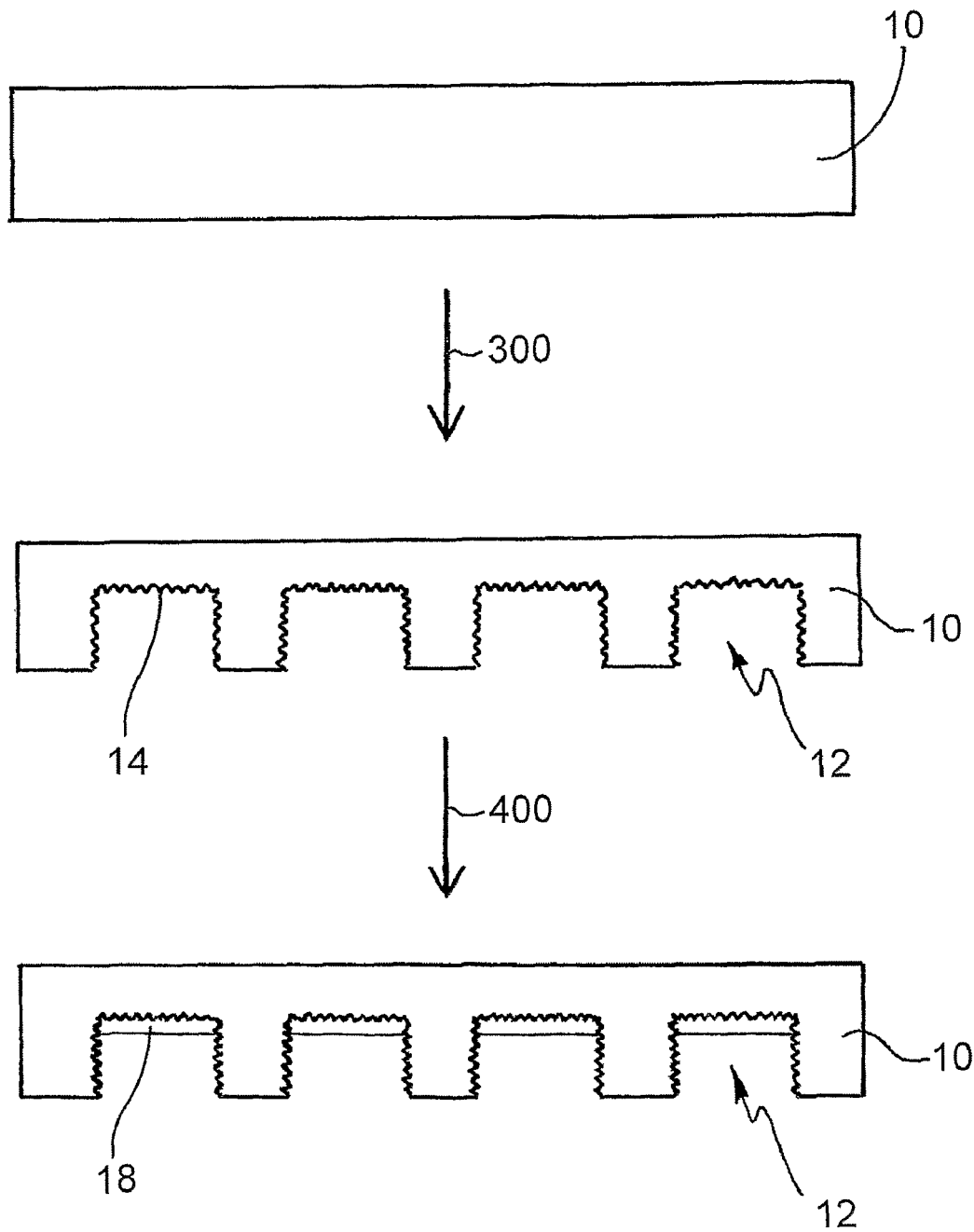
FIG. 5 illustrates the steps in manufacturing a transparent encapsulating sheet in accordance with an embodiment of the present invention.

With reference to FIG. 5, Cavities 12 are formed by etching a glass sheet 10 in a first step 300. The etch step typically is carried out by sandblasting which produces a frosted surface 14 on the interior of the cavities 12 which is substantially opaque. In order to convert the frosted cavity glass into transparent cavity glass, the cavity glass is coated with a low viscosity transparent epoxy resin 18 in step 400, the epoxy resin being selected to be index matched with the glass. The epoxy resin fills micro cracks in the frosted surface and, after UV curing, renders the frosted surface transparent.

Figure 6A:
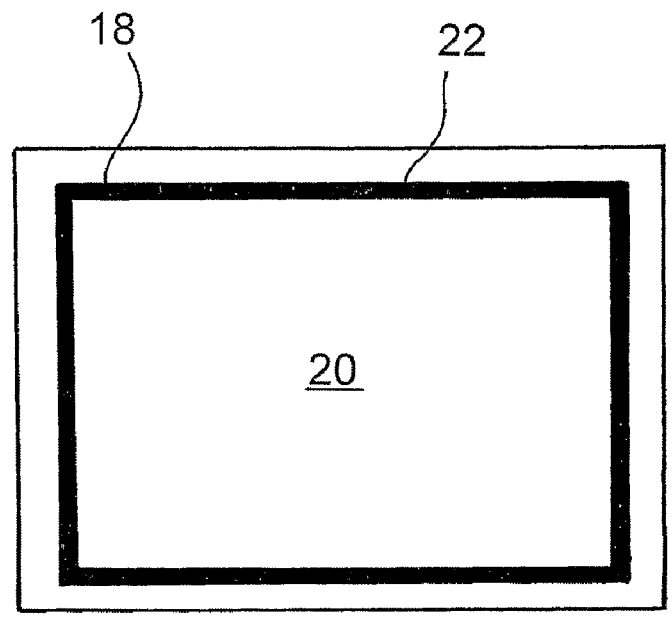
FIG. 6a is a top-plan schematic view of a light-emissive device according to an embodiment of the present invention.

Referring to FIG. 6a, a top-plan schematic view of a light-emissive device according to an embodiment of the present invention comprises device 20 coated with the low viscosity transparent epoxy resin 18 in step 400. Around the periphery of the device is a trench 22 acting as an overspill trench 22 to receive excess material of the epoxy resin 18 deposited in step 400.

Figure 6B:
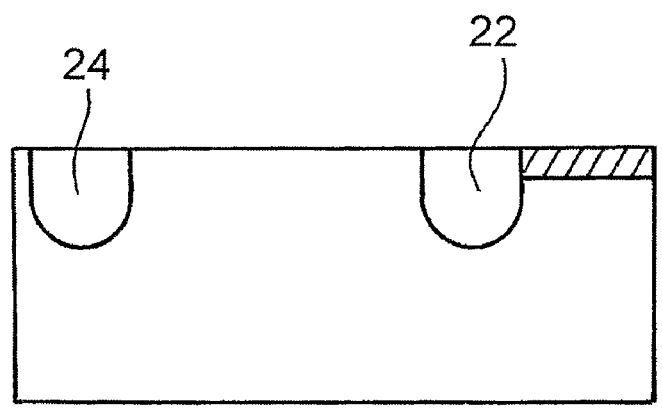
FIG. 6b is a cross-sectional schematic view of a light-emissive device according to an embodiment of the present invention.

As best seen in FIG. 6b, the periphery of the light-emissive device can comprise the overspill trench 22 in addition to an adhesive overspill trench 24. The overspill trench may comprise both getter material and adhesive material.

While this invention has been particularly shown and described with reference to preferred embodiments, it will be understood to those skilled in the art that various changes in form and detail may be made without departing from the scope of the invention as defined by the appendant claims.

The invention claimed is:

1. A method of manufacturing a transparent encapsulating sheet for a light-emissive device, the method comprising: forming a plurality of cavities in one side of a transparent sheet of material for receiving light-emissive structures therein to produce a frosted surface comprising micro cracks in the cavities; and, coating said frosted surface with a low viscosity material comprising a getter material whereby the micro cracks in the frosted surface are filled with the low viscosity material in order to form the transparent encapsulating sheet.

2. A method according to claim 1, wherein said coating comprises pouring the low viscosity material into the cavities and over the frosted surfaces.

3. A method according to claim 1, wherein the transparent sheet comprises a glass material having a thickness in the range 0.7 to 1.5 mm and wherein the cavities have a depth in the range 0.35 mm to 0.75 mm.

4. A method according to claim 1, wherein the low viscosity material has a refractive index within 0.2 of the material of the transparent sheet.

5. A method according to claim 1, wherein the low viscosity material is selected from the group consisting of epoxy resins, silicon gels, hydrocarbon blends, and starches.

6. A method according to claim 5, wherein the low viscosity material comprises an epoxy resin, the epoxy resin comprising an epoxy and a filler, the filler comprising particles of 10 micrometer diameter or less.

7. A method according to claim 1, comprising coating the low viscosity material to a depth of between 50 and 1000 micrometers.

8. A method of manufacturing a pre-form comprising depositing a plurality of light-emissive structures on a substrate, depositing a low viscosity material over the light-emissive structures, and encapsulating the plurality of light-emissive structures using an encapsulating sheet comprising cavities with frosted surfaces having micro cracks, whereby the low viscosity material coats the frosted surfaces and fills the micro cracks thereby forming a transparent encapsulant.

9. The method according to claim 8, wherein the low viscosity material is cured after encapsulating the plurality of light-emissive structures using the encapsulating sheet.

10. A pre-form manufactured according to the method as claimed in claim 8, wherein the transparent material within each cavity extends from the transparent sheet to an upper surface of the light-emissive structure thereby completely filling space between the transparent sheet and the upper surface of the light-emissive structure.

* * * * *